(12) United States Patent
Chiang et al.

(10) Patent No.: US 12,740,108 B2
(45) Date of Patent: Sep. 15, 2026

(54) SEMICONDUCTOR DEVICE HAVING A BUMP BETWEEN FIN-SHAPED STRUCTURES

(71) Applicant: UNITED MICROELECTRONICS CORP., Hsin-Chu City (TW)

(72) Inventors: Chun-Ting Chiang, Kaohsiung City (TW); Tien-Shan Hsu, Tainan City (TW); Po-Chang Lin, Tainan City (TW); Lung-En Kuo, Tainan City (TW); Hao-Che Feng, Kaohsiung City (TW); Ping-Wei Huang, Pingtung County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 409 days.

(21) Appl. No.: 18/383,035

(22) Filed: Oct. 23, 2023

(65) Prior Publication Data

US 2025/0098238 A1 Mar. 20, 2025

(30) Foreign Application Priority Data

Sep. 20, 2023 (TW) ................................ 112135877

(51) Int. Cl.

| | |
|---|---|
| ***H10D 62/10*** | (2025.01) |
| ***H10D 30/01*** | (2025.01) |
| ***H10D 30/62*** | (2025.01) |
| ***H10D 84/01*** | (2026.01) |
| ***H10D 84/03*** | (2025.01) |
| ***H10D 84/83*** | (2025.01) |

(52) U.S. Cl.

CPC ......... *H10D 62/117* (2025.01); *H10D 30/024* (2025.01); *H10D 30/6211* (2025.01); *H10D 30/6213* (2025.01); *H10D 84/0151* (2025.01); *H10D 84/0158* (2025.01); *H10D 84/038* (2025.01); *H10D 84/834* (2025.01)

(58) Field of Classification Search

CPC ............... H10D 62/117; H10D 30/024; H10D 30/6211; H10D 30/6213; H10D 84/0151; H10D 84/0158; H10D 84/038; H10D 84/834

See application file for complete search history.

(56) References Cited

U.S. PATENT DOCUMENTS

| | | | | |
|---|---|---|---|---|
| 8,969,974 | B2 | 3/2015 | Liaw | |
| 11,251,289 | B2 * | 2/2022 | Chang ................ | H10D 30/0243 |
| 2018/0337251 | A1 * | 11/2018 | Chang ................ | H10D 84/0151 |

* cited by examiner

*Primary Examiner* — J. E. Schoenholtz
(74) *Attorney, Agent, or Firm* — Winston Hsu

(57) ABSTRACT

A semiconductor device includes a first fin-shaped structure and a second fin-shaped structure on a substrate, a bump between the first fin-shaped structure and the second fin-shaped structure, a first recess between the first fin-shaped structure and the bump, and a second recess between the second fin-shaped structure and the bump. Preferably, a top surface of the bump includes a curve concave upward, a width of the bump is greater than twice the width of the first fin-shaped structure, and a height of the bump is less than one fourth of the height of the first fin-shaped structure.

5 Claims, 4 Drawing Sheets

SEMICONDUCTOR DEVICE HAVING A BUMP BETWEEN FIN-SHAPED STRUCTURES

BACKGROUND OF THE INVENTION

1. Field of the Invention

The invention relates to a semiconductor device, and more particularly, to a semiconductor device having a bump formed between fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure, defects are often found on the top surface of the STI as a result of numerous etching processes or other factors. Hence how to improve the current FinFET fabrication and structure has become an important task in this field.

SUMMARY OF THE INVENTION

According to an embodiment of the present invention, a semiconductor device includes a first fin-shaped structure and a second fin-shaped structure on a substrate, a bump between the first fin-shaped structure and the second fin-shaped structure, a first recess between the first fin-shaped structure and the bump, and a second recess between the second fin-shaped structure and the bump. Preferably, a top surface of the bump includes a curve concave upward, a width of the bump is greater than twice the width of the first fin-shaped structure, and a height of the bump is less than one fourth of the height of the first fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
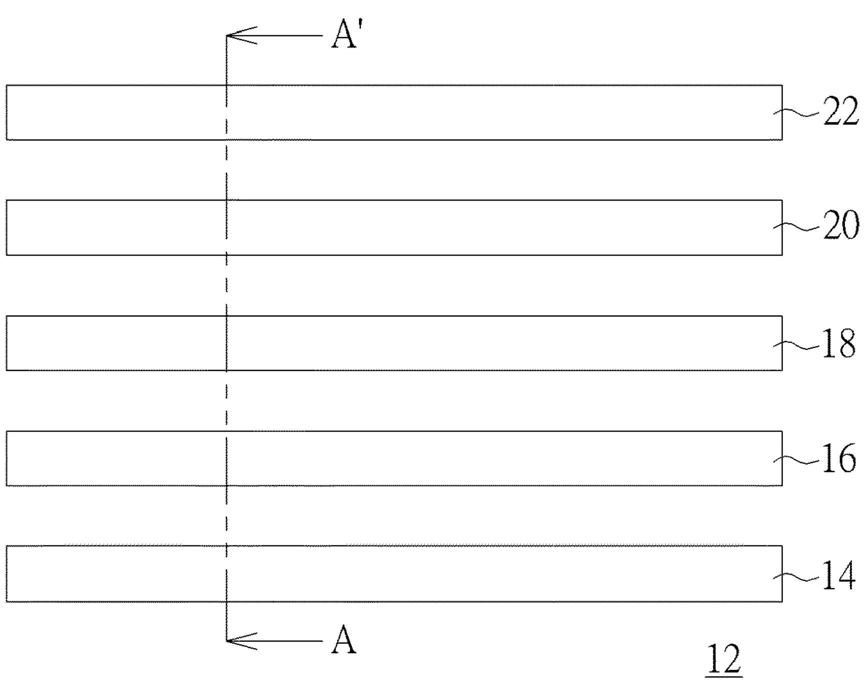
FIGS. 1-6 illustrate a method for fabricating a semiconductor device according to an embodiment of the present invention.
Figure 2:
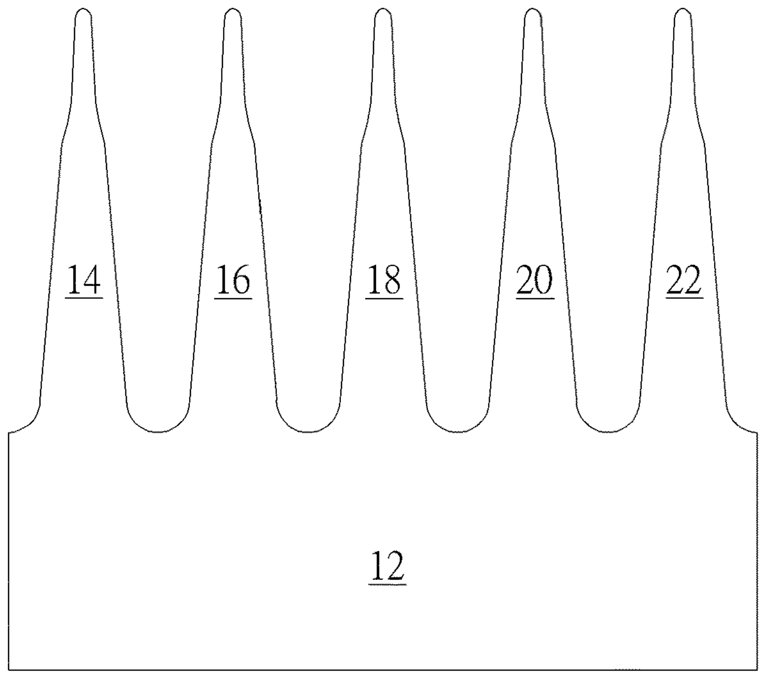

Referring to FIGS. 1-6, FIGS. 1-6 illustrate a method for fabricating a semiconductor device according to an embodiment of the present invention, in which FIG. 1 illustrates a top view for fabricating a semiconductor device according to an embodiment of the present invention and FIGS. 2-6 illustrate cross-section views for fabricating the semiconductor device taken along the sectional line AA' of FIG. 1. As shown in FIGS. 1-2, a substrate 12 such as a silicon substrate or silicon-on-insulator (SOI) substrate is first provided, and a plurality of fin-shaped structures 14, 16, 18, 20, 22 extending along a first direction (such as the X-direction) are formed on the substrate 12. It should be noted that even though five fin-shaped structures 14, 16, 18, 20, 22 are disposed on the substrate 12 in this embodiment, it would also be desirable to adjust the number of fin-shaped structures depending on the demand of the product, which is also within the scope of the present invention.

Preferably, the fin-shaped structures 14, 16, 18, 20, 22 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath for forming the fin-shaped structures 14, 16, 18, 20, 22.

Alternatively, the fin-shaped structures 14, 16, 18, 20, 22 could also be obtained by first forming a patterned mask (not shown) on the substrate, 12, and through an etching process, the pattern of the patterned mask is transferred to the substrate 12 to form the fin-shaped structures 14, 16, 18, 20, 22. Moreover, the formation of the fin-shaped structures 14, 16, 18, 20, 22 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14, 16, 18, 20, 22. These approaches for forming fin-shaped structures are all within the scope of the present invention.

Figure 3:
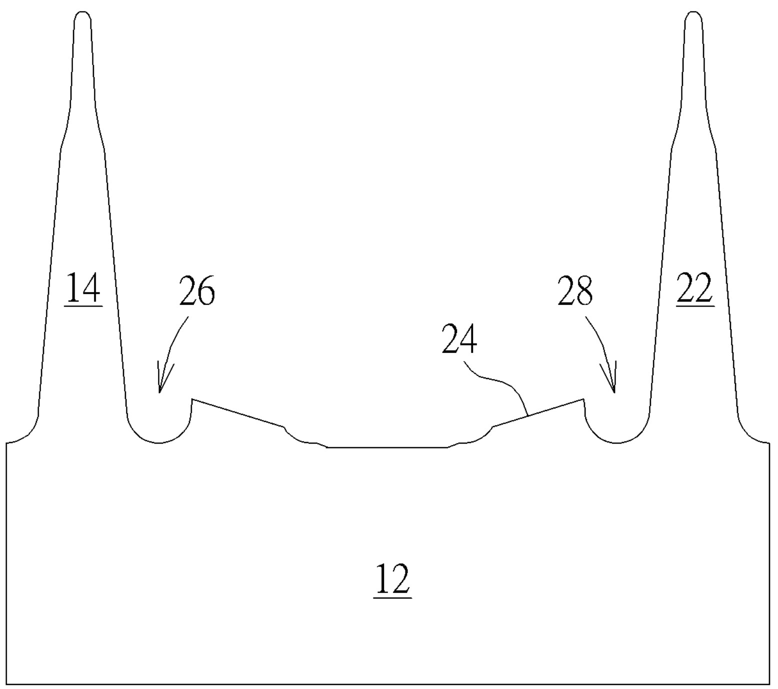

Next, as shown in FIG. 3, a fin remove and/or fin cut process could be conducted by first forming a patterned mask (not shown) such as patterned resist to cover the leftmost and rightmost fin-shaped structures 14, 22, and then using an etching process to remove the three fin-shaped structures 16, 18, 20 in the middle for forming a large area bump 24 on the surface of the substrate 12 between the fin-shaped structures 14 and 22, a recess 26 between the left fin-shaped structure 14 and the bump 24, and another recess 28 between the right fin-shaped structure 22 and the bump 24. Preferably, the surface of the bump 24 is slightly higher than the substrate 12 surface on left side of the fin-shaped structures 14 and on right side of the fin-shaped structure 22.

In this embodiment, the removal of the middle three fin-shaped structures 16, 18, 20 and formation of the bump 24 through the aforementioned etching process could be accomplished by reducing the gas content of tetrafluoromethane ($CF_4$) while increasing hydrogen bromide (HBr). In other words, the etching process conducted at this stage is achieved by increasing the ratio of HBr to $CF_4$.

Specifically, the top surface of the bump 24 formed at this stage includes a curve concave upward, in which an angle included by the planar surface of the bump 24 in the center and the curved surface on either left or right side of the bump 24 is preferably less than 40 degrees or most preferably between 20-30 degrees. It should be noted that since the original five fin-shaped structures 14, 16, 18, 20, 22 have equal width or pitch therebetween as the bump 24 is formed by removing the middle three fin-shaped structures 16, 18, 20, the overall width of the bump 24 is preferably greater than twice the width of the left fin-shaped structure 14 or the right fin-shaped structure 22, greater than three times the width of the left fin-shaped structure 14 or the right fin-shaped structure 22, or between four to six times the width of the left fin-shaped structure 14 or the right fin-shaped structure 22. Moreover, the height of the bump 24 is less than ¼ of the overall height of the left fin-shaped structure 14 or the right fin-shaped structure 22, in which the height of the bump 24 could be defined as the distance measuring from the bottommost portion of the bump 24 even with bottom surface of the recesses 26, 28 to the topmost portion of the bump 24 immediately adjacent to the recesses 26, 28.

Figure 4:
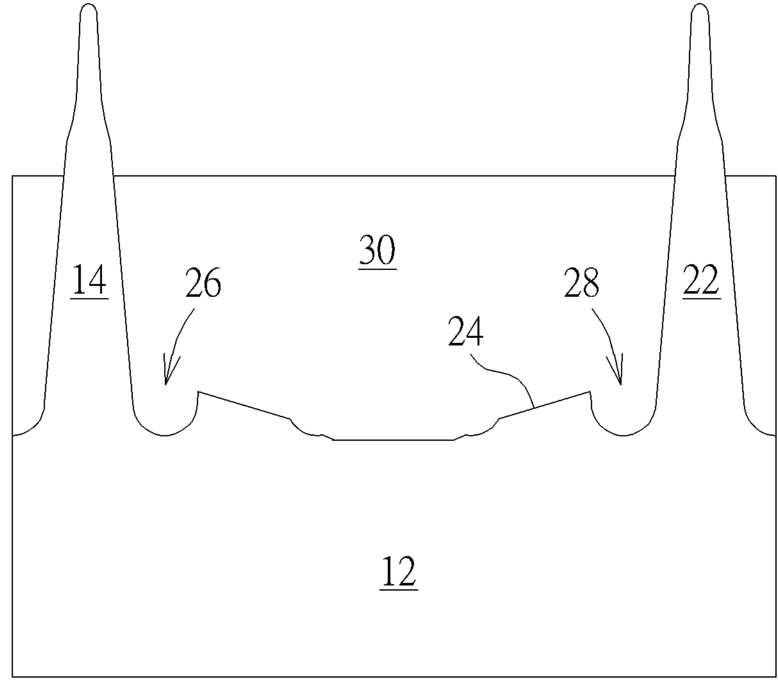

Next, as shown in FIG. 4, a shallow trench isolation (STI) 30 is formed around the fin-shaped structure 14, 22 and disposed on the bump 24. In this embodiment, the formation of the STI 30 could be accomplished by conducting a flowable chemical vapor deposition (FCVD) process to form a silicon oxide layer on the substrate 12 and covering the fin-shaped structures 14, 22 entirely. Next, a chemical mechanical polishing (CMP) process along with an etching process are conducted to remove part of the silicon oxide layer so that the top surface of the remaining silicon oxide is even with or slightly lower than the top surface of the fin-shaped structures 14, 22 for forming the STI 30.

Figure 5:
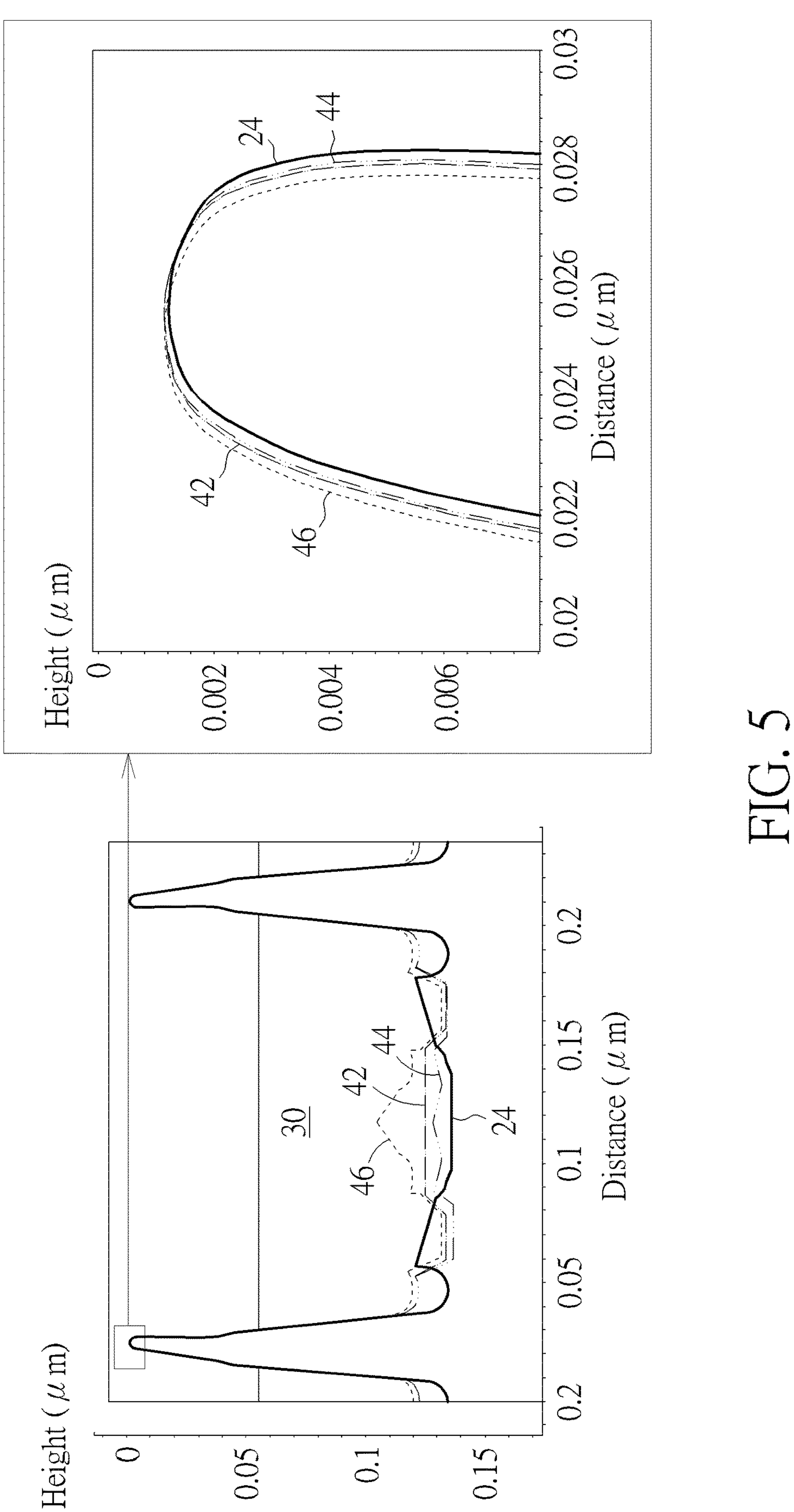

Referring to FIG. 5, FIG. 5 illustrates a structural view of a semiconductor device according to an embodiment of the present invention, in which left portion of FIG. 5 illustrates structural views of bumps having different variations and right portion of FIG. 5 illustrates tip portion of the fin-shaped structure corresponding to bumps having different variations. As shown in FIG. 5, by using the aforementioned etching recipe to remove the middle three fin-shaped structures 16, 18, 20, it would be desirable to form bumps having various profiles through adjusting the recipe and using different parameters of the etching process. For instance, it would be desirable to form a bump 42 having a completely planar surface, a bump 44 having a wavy surface, a bump 46 having a mountainous surface, and a bump 24 having curve concave upward as disclosed previously. Preferably, the overall width of each of the bumps 42, 44, 46 is less than the overall width of the bump 24. For instance, the width of each of the bumps 42, 44, 46 is preferably less than 90%, 80%, 70%, 60%, or even less than 50% of the width of the bump 24.

It should be noted after a STI 30 is formed directly on top of the bumps 24, 42, 44, 46, a stress is generated between the left fin-shaped structure 14 and the right fin-shaped structure 22 and this stress, under an optimal condition could cause a bending effect on the left fin-shaped structure 14 and the right fin-shaped structure 22. According to experiment data measured from a preferred embodiment of the present invention, the degree of bending of the fin-shaped structures is inversely proportional to the defect count of the device. In other words, by using the bending on tip of the fin-shaped structures created by the curved surface of the bump 24 through stress, the overall defect count of the device could be reduced substantially.

It should also be noted that as shown on the right portion of FIG. 5, the degree of bending of the bump 24 having curve concave upward is greater than the bump 44 having wavy top surface, the degree of bending of the bump 44 having wavy top surface is greater than the bump 42 having completely planar top surface, and the degree of bending of the bump 42 having completely planar top surface if greater than the bump 46 having mountainous shape top surface. In other words, the defect count of the bump 24 having curve concave upward is less than the bump 44 having wavy top surface, the defect count of the bump 44 having wavy top surface is less than the bump 42 having completely planar top surface, and the defect count of the bump 42 having completely planar top surface is less than the bump 46 having mountainous shape top surface. Hence overall, the degree of bending as well as defect count of the bump 24 having curve concave upward is substantially better than other bumps 42, 44, 46.

Figure 6:
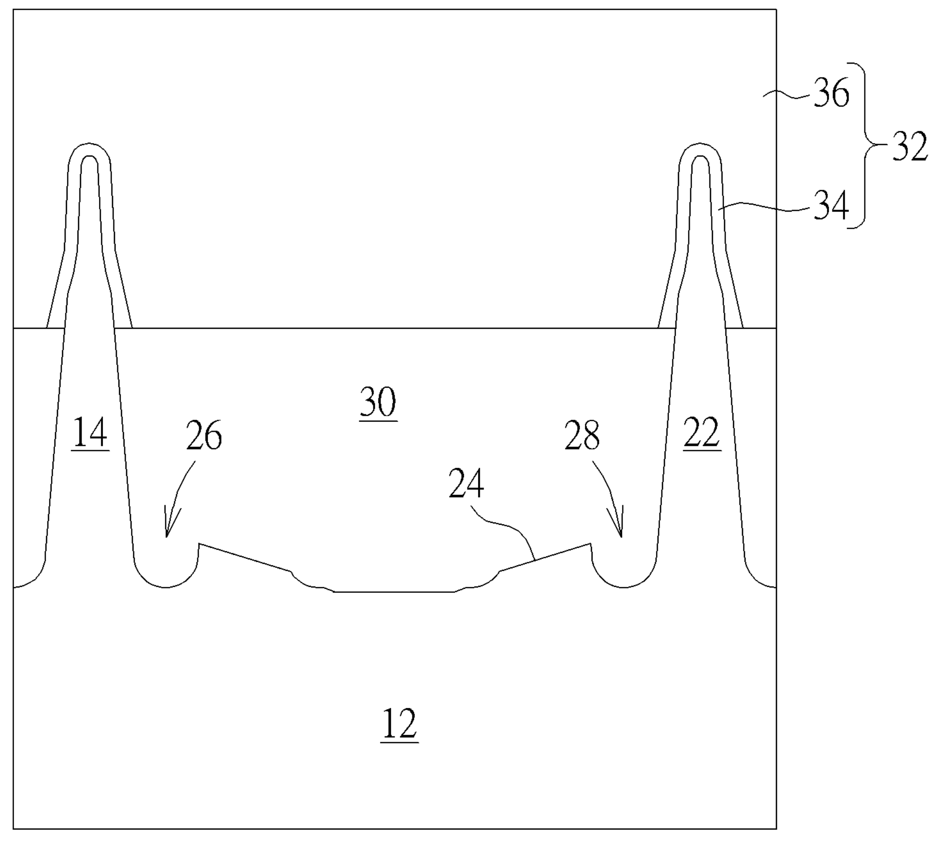

Referring to FIG. 6, FIG. 6 illustrates a structural view for fabricating the semiconductor device following FIG. 4 according to an embodiment of the present invention. As shown in FIG. 6, at least a gate structure 32 could then be formed on the fin-shaped structures 14, 22 and the STI 30. In this embodiment, the formation of the gate structure 32 could be accomplished by a gate first process, a high-k first approach from gate last process, or a high-k last approach from gate last process. For instance, a gate dielectric layer 34 or interfacial layer made of silicon oxide, a gate material layer 36 made of polysilicon, and a selective hard mask (not shown) could be formed sequentially on the substrate 12, and a photo-etching process is then conducted by using a patterned resist (not shown) as mask to remove part of the gate material layer 36 and part of the gate dielectric layer 34 through single or multiple etching processes. After stripping the patterned resist, a gate structure 32 composed of a patterned gate dielectric layer 34 and a patterned material layer 36 are formed on the substrate 12.

Next, standard transistor fabrication could be carried out by forming a spacer on sidewalls of the gate structure 32, forming a source/drain region in the substrate 12 and/or fin-shaped structures 14, 22 adjacent to two sides of the spacer, forming an interlayer dielectric (ILD) layer on the gate structure 32, and then forming contact plugs in the ILD layer to electrically connect to the source/drain region. Since standard transistor fabrication process is well known to those skilled in the art, the details of which are not explained herein for the sake of brevity.

Overall, the present invention preferably adjusts the recipe of the etching gas used during fin remove or fin cut process by increasing the ratio of HBr to $CF_4$ for removing multiple or specifically three fin-shaped structures from a total of five fin-shaped structures in the aforementioned embodiment and forming a large area bump in between the remaining two fin-shaped structures 14, 22. According to a preferred embodiment of the present invention, the overall width of the bump 24 is greater than two times or even three times the overall width of each of the remaining fin-shaped structures 14, 22 on two adjacent sides and the top surface of the bump 24 also includes a curve concave upward. Preferably, the distinct upward curve of the bump could be used to generate stress after a STI is formed so that bending effect is facilitated on the fin-shaped structures 14, 22 on two adjacent sides. As bending of the fin-shaped structures increase, the overall defect count of the device also decreases accordingly and performance and yield of the product is improved substantially.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor device, comprising:

a first fin-shaped structure and a second fin-shaped structure on a substrate; and a bump between the first fin-shaped structure and the second fin-shaped structure, wherein a top surface of the bump comprises a curve concave upward and a width of the curve concave upward is greater than twice a width of the first fin-shaped structure.

2. The semiconductor device of claim 1, further comprising:

a first recess between the first fin-shaped structure and the bump; and a second recess between the second fin-shaped structure and the bump.

3. The semiconductor device of claim 1, wherein a width of the bump is greater than twice the width of the first fin-shaped structure.

4. The semiconductor device of claim 2, wherein a width of the bump is greater than three times the width of the first fin-shaped structure.

5. The semiconductor device of claim 2, wherein a height of the bump is less than one fourth of the height of the first fin-shaped structure and the height of the bump is measured from a bottommost portion of the bump even with a bottom surface of the first recess to a topmost portion of the bump.

* * * * *